United States Patent
Shimizu et al.

(10) Patent No.: US 7,455,747 B2
(45) Date of Patent: Nov. 25, 2008

(54) SUBSTRATE PROCESSING APPARATUS, CONTROL METHOD FOR THE APPARATUS, AND PROGRAM FOR IMPLEMENTING THE METHOD

(75) Inventors: Noriaki Shimizu, Nirasaki (JP); Masahiro Numakura, Miyagi-gun (JP)

(73) Assignee: Tokyo Electron Limited, Tokyo (JP)

( * ) Notice: Subject to any disclaimer, the term of this patent is extended or adjusted under 35 U.S.C. 154(b) by 273 days.

(21) Appl. No.: 10/984,982

(22) Filed: Nov. 10, 2004

(65) Prior Publication Data

US 2005/0124084 A1 Jun. 9, 2005

(30) Foreign Application Priority Data

Nov. 12, 2003 (JP) .............................. 2003-383008

(51) Int. Cl.
| | |
|---|---|
| H01L 21/306 | (2006.01) |
| H01L 21/67 | (2006.01) |
| B05C 11/00 | (2006.01) |
| C23C 16/00 | (2006.01) |
| G06F 19/00 | (2006.01) |

(52) U.S. Cl. ........................... 156/345.24; 156/345.31; 156/345.32; 118/696; 118/712; 118/719; 438/14; 700/121

(58) Field of Classification Search ................... 438/14; 118/712, 719; 156/345.31, 345.24, 345.32; 414/935–941; 700/121
See application file for complete search history.

(56) References Cited

U.S. PATENT DOCUMENTS

| 5,934,856 | A | 8/1999 | Asakawa et al. |
| 2003/0182012 | A1* | 9/2003 | Yamauchi et al. ........... 700/121 |
| 2004/0105737 | A1 | 6/2004 | Ozawa et al. |

FOREIGN PATENT DOCUMENTS

| JP | 8-46013 | 2/1996 |
| JP | 2000-150618 | 5/2000 |
| JP | 2001-53131 | 2/2001 |

* cited by examiner

*Primary Examiner*—Walter L. Lindsay, Jr.
*Assistant Examiner*—Ron E Pompey
(74) *Attorney, Agent, or Firm*—Oblon, Spivak, McClelland, Maier & Neustadt, P.C.

(57) ABSTRACT

A substrate processing apparatus, according to which inspection of various devices in the substrate processing apparatus can be carried out with improved reliability, while reducing the burden on a user. A processing chamber processes semiconductor wafers therein. A transfer chamber transfers the semiconductor wafers. A FOUP (front opening unified pod) houses a plurality of dummy wafers for inspection of the processing chamber or the transfer chamber. A CPU causes an HDD (hard disk drive) to store a housing state relating to the arrangement of the dummy wafers in the FOUP before replacement of dummy wafers in the FOUP and that after the replacement as dummy wafer setup information.

3 Claims, 6 Drawing Sheets

SUBSTRATE PROCESSING APPARATUS, CONTROL METHOD FOR THE APPARATUS, AND PROGRAM FOR IMPLEMENTING THE METHOD

BACKGROUND OF THE INVENTION

1. Field of the Invention

The present invention relates to a substrate processing apparatus that carries out processing on substrates as objects to be processed, a control method for the apparatus, and a program for implementing the method, and in particular relates to a substrate processing apparatus that carries out processing on dummy wafers, a control method for the apparatus, and a program for implementing the method.

2. Description of the Related Art

Conventionally, in the manufacture of substrates (objects to be processed) for flat panel displays, semiconductor wafers and so on, substrate processing apparatuses comprised of at least one load lock chamber, at least one transfer chamber, and at least one processing chamber have been used to carry out various types of processing such as film formation, oxidation, diffusion, etching, and annealing. As such substrate processing apparatuses, at least the two types described below are known.

One type is a multi-chamber type substrate processing apparatus. Such a substrate processing apparatus is comprised of three to six processing chambers, a vacuum preparation chamber (load lock chamber) having therein a transfer mechanism for transferring semiconductor wafers into and out of a transfer chamber, described below, the transfer chamber which is polygonal in shape around which are disposed the processing chambers and the load lock chamber and which has a plurality of connecting ports formed in peripheral walls thereof for communicating in gas-tight fashion with the processing chambers and the load lock chamber via gate valves, and a transfer arm that is provided inside the transfer chamber and is able to turn, elongate and contract (see Japanese Laid-open Patent Publication (Kokai) No. H08-46013).

Moreover, the other type is a substrate processing apparatus having chambers in a straight line. Such a substrate processing apparatus has a vacuum processing chamber in which etching is carried out on semiconductor wafers, and a load lock chamber having built therein a scalar type single pick type or scalar type twin pick type transfer arm as transfer means for carrying out handover of the semiconductor wafers between the load lock chamber and the vacuum processing chamber (see Japanese Laid-open Patent Publication (Kokai) No. 2001-53131 and Japanese Laid-open Patent Publication (Kokai) No. 2000-150618).

Each of the types of substrate processing apparatus described above has an object-to-be-processed transferring in/out stage that is connected to the load lock chamber and has a transfer mechanism for transferring semiconductor wafers in and out, and ports on each of which is installed a FOUP (front opening unified pod), described below, as a cassette housing a plurality of unprocessed semiconductor wafers. The object-to-be-processed transferring in/out stage is for transferring the semiconductor wafers in and out between the load lock chamber and the FOUPs.

Moreover, in each of the types of substrate processing apparatus described above, inspection of the processing chamber(s), the load lock chamber and so on must be carried out periodically to check on the state of processing in the processing chamber(s), the state of operation of the transfer mechanism in the load lock chamber and so on. In each such inspection, a non-product wafer called a "dummy wafer" is used, the dummy wafer being actually subjected to processing in the processing chamber, and transferred by the transfer arm. As with the semiconductor wafers described above, a plurality of such dummy wafers are also housed in a FOUP, this FOUP being installed on a special port for exclusive use of this FOUP possessed by the object-to-be-processed (substrate) transferring in/out stage.

FIG. 6 is a view schematically showing the construction of a FOUP housing semiconductor wafers or dummy wafers.

In FIG. 6, the FOUP 500 is a transfer cassette standardized according to J300 (Japan Electronics and Information Technology Industries Association) and I300I (International 300 mm Initiative), and is comprised of a main body 501 which is a container that has a U-shape when viewed from above, has a shape thrust out from an upper surface thereof, and is open at a side thereof opposite a curved side thereof, and a lid 502 that is provided over the opening in the side of the main body 501 and enables this opening to be opened and closed freely. The main body 501 has a plurality of slots (not shown) therein, each slot being able to hold a peripheral edge portion of a 300 mm-diameter semiconductor wafer or a dummy wafer such that the semiconductor wafer or the dummy wafer can be housed in the main body 501 parallel to the upper surface of the main body 501. By inserting a semiconductor wafer or a dummy wafer 503 into each slot, a plurality of semiconductor wafers or dummy wafers 503 can be housed parallel to one another. The lid 502 has sealing rubber made of NBR or the like on a peripheral edge portion thereof that contacts the main body 501, whereby the inside of the main body 501 can be tightly sealed. Moreover, either of the main body 501 and the lid 502 may be made of a resin such as ABS.

Moreover, in addition to such FOUPs 500, pods housing 200 mm-diameter semiconductor wafers are also known as containers for housing semiconductor wafers.

In general, the specification of a dummy wafer varies according to the type of inspection to be carried out, and hence the FOUP 500 houses dummy wafers of a plurality of different types. A housing state relating to the arrangement of the dummy wafers in the FOUP 500 is stored as setup information in an HDD or the like in a control unit (not shown) possessed by the substrate processing apparatus, and in each of periodic inspections during mass production of semiconductor wafers, the control unit selects a dummy wafer suitable for the inspection while referring to the stored setup information, and transfers this dummy wafer out from the FOUP 500. Once even one of the dummy wafers housed in the FOUP 500 reaches its lifetime (usage limit), the FOUP 500 is removed from the object-to-be-processed transferring in/out stage, and a user replaces the dummy wafer that has reached its lifetime.

During this dummy wafer replacement, it is not necessarily the case that the dummy wafer inserted into a particular slot is for the same type of inspection as the dummy wafer that was in that slot before the replacement, and in particular this is hardly ever the case in a semiconductor wafer trial manufacturing plant or the like. Consequently, if the substrate processing apparatus continues to use the setup information for the dummy wafers in the FOUP 500 as it is, then confusion may arise. Therefore, with conventional substrate processing apparatuses, it has been the case for example that, upon carrying out dummy wafer replacement, the setup information for the dummy wafers in the FOUP 500 is deleted from the HDD or the like, and then, while checking the actual housing state of dummy wafers in the FOUP 500 after the dummy wafer replacement, a user inputs/sets setup information corresponding to this housing state to the substrate processing apparatus.

However, the lifetime of a dummy wafer is approximately 1 to 2 weeks during mass production of semiconductor wafers, and in particular is only approximately 2 to 3 days in the case of inspection of processing in a corrosive system. Under such a situation, there is a problem that if the setup information for the dummy wafers in the FOUP 500 is deleted from the HDDD or the like of the substrate processing apparatus, then the user must newly input/set setup information to the substrate processing apparatus every time dummy wafer replacement is carried out and hence there is a considerable burden on the user.

Furthermore, in mass production of semiconductor wafers, during dummy wafer replacement, it is mostly the case that the dummy wafer inserted into a particular slot is for the same type of inspection as the dummy wafer that was in that slot before the replacement, and hence there is little fear of the confusion described above arising; if anything, there is a problem that during inputting/setting of setup information by the user, mismatches between the inputted/set setup information and the actual housing state of the dummy wafers in the FOUP 500 may arise due to input mistakes, resulting in it not being possible to carry out inspection of the various devices in the substrate processing apparatus smoothly, and hence there being a drop in reliability.

SUMMARY OF THE INVENTION

It is an object of the present invention to provide a substrate processing apparatus, a control method for the apparatus, and a program for implementing the method, according to which inspection of various devices in the substrate processing apparatus can be carried out with improved reliability, while reducing the burden on a user.

To attain the above object, in a first aspect of the present invention, there is provided a substrate processing apparatus comprising at least one vacuum processing chamber in which substrates are processed, at least one transfer chamber for transferring the substrates, at least one container housing a plurality of inspection substrates for inspection of the vacuum processing chamber or the transfer chamber, a storage device, and a controller that causes the storage device to store a housing state relating to an arrangement of the inspection substrates in the container before replacement of inspection substrates in the container and that after the replacement as setup information.

Preferably, the substrate processing apparatus comprises a display device on which is displayed contents of the setup information, and the controller causes the storage device to store a plurality of sets of setup information, and is responsive to installation of the container, for causing the display device to display contents of a desired set of setup information selected from the plurality of sets of setup information.

More preferably, the controller causes the storage device to store another set of setup information obtained by carrying out editing based on the selected desired set of setup information.

Preferably, the substrate processing apparatus comprises a plurality of containers, each housing a plurality of inspection substrates for inspection of the vacuum processing chamber or the transfer chamber, and the controller selects, as an inspection substrate to be used in inspection of the vacuum processing chamber or the transfer chamber, a container housing an inspection substrate having a shortest lifetime out of the containers, and selects an inspection substrate having a longest lifetime out of the inspection substrates in the selected container.

To attain the above object, in a second aspect of the present invention, there is provided a control method for a substrate processing apparatus comprising at least one vacuum processing chamber in which substrates are processed, at least one transfer chamber for transferring the substrates, at least one container housing a plurality of inspection substrates for inspection of the vacuum processing chamber or the transfer chamber, and a storage device, comprising a control step of causing the storage device to store a housing state relating to an arrangement of the inspection substrates in the container before replacement of inspection substrates in the container and that after the replacement as setup information.

Preferably, the substrate processing apparatus comprises a display device on which is displayed contents of the setup information, and the control step causes the storage device to store a plurality of sets of setup information and is responsive to installation of the container, for causing the display device to display contents of a desired set of setup information selected from the plurality of sets of setup information.

More preferably, the control step causes the storage device to store another set of setup information obtained by carrying out editing based on the selected desired set of setup information.

Preferably, the substrate processing apparatus comprises a plurality of containers, each housing a plurality of inspection substrates for inspection of the vacuum processing chamber or the transfer chamber, and the control step selects a container housing an inspection substrate having a shortest lifetime out of the containers, and selects an inspection substrate having a longest lifetime out of the inspection substrates in the selected container, the selected inspection substrate being used in inspection of the vacuum processing chamber or the transfer chamber.

To attain the above object, in a third aspect of the present invention, there is provided a program implementing a control method for a substrate processing apparatus comprising at least one vacuum processing chamber in which substrates are processed, at least one transfer chamber for transferring the substrates, at least one container housing a plurality of inspection substrates for inspection of the vacuum processing chamber or the transfer chamber, and a storage device, the program comprising a control module for causing the storage device to store a housing state relating to an arrangement of the inspection substrates in the container before replacement of inspection substrates in the container and that after the replacement as setup information.

Preferably, the substrate processing apparatus comprises a display device on which is displayed contents of the setup information, and the control module causes the storage device to store a plurality of sets of setup information, and is responsive to installation of the container, for causing the display device to display contents of a desired set of setup information selected from the plurality of sets of setup information.

More preferably, the control module causes the storage device to store another set of setup information obtained by carrying out editing based on the selected desired set of setup information.

Preferably, the substrate processing apparatus comprises a plurality of the containers, each housing a plurality of inspection substrates for inspection of the vacuum processing chamber or the transfer chamber, and the control module selects a container housing an inspection substrate having a shortest lifetime out of the containers, and selecting an inspection substrate having a longest lifetime out of the inspection substrates in the selected container, the selected inspection substrate being used in inspection of the vacuum processing chamber or the transfer chamber.

According to the present invention, the housing state relating to the arrangement of the inspection substrates in the container is stored as setup information over a period spanning before and after replacement of inspection substrates in the container. As a result, the necessity for a user to newly input/set setup information to the substrate processing apparatus every time inspection substrate replacement is carried out is eliminated, and moreover mismatches between the inputted/set setup information and the actual housing state of inspection substrates in the container due to input mistakes by the user can be prevented. The reliability of inspection of the various devices in the substrate processing apparatus can thus be improved, while reducing the burden on the user.

According to the present invention, a plurality of sets of setup information may be stored, and in response to installation of the container, contents of a desired set of setup information selected from the plurality of stored sets of setup information may be displayed. As a result, during inspection substrate replacement, the efficiency of inputting/setting of setup information by the user can be improved.

According to the present invention, another set of setup information obtained by carrying out editing based on the selected desired set of setup information may be stored. As a result, the user can input/set a new set of setup information based on the desired set of setup information selected by the user, and hence the efficiency of inputting/setting of the setup information by the user can be further improved, and moreover input mistakes by the user can be reduced as much as possible, and hence the reliability of inspection of the various devices in the substrate processing apparatus can be further improved.

According to the present invention, an inspection substrate to be used in inspection of the vacuum processing chamber or the transfer chamber may be selected by selecting a container housing an inspection substrate having the shortest lifetime out of a plurality of containers, and selecting an inspection substrate having the longest lifetime out of the inspection substrates in the selected container. As a result, a situation in which inspection substrates housed in a plurality of containers each reach their lifetime at the same time and hence a plurality of containers have to be removed from the substrate processing apparatus simultaneously can be prevented, and hence the efficiency of inspection of the vacuum processing chamber or the transfer chamber can be improved.

The above and other objects, features, and advantages of the invention will become more apparent from the following detailed description taken in conjunction with the accompanying drawings.

DETAILED DESCRIPTION OF THE PREFERRED EMBODIMENTS

The present invention will now be described in detail with reference to the drawings showing preferred embodiments thereof.

Figure 1:
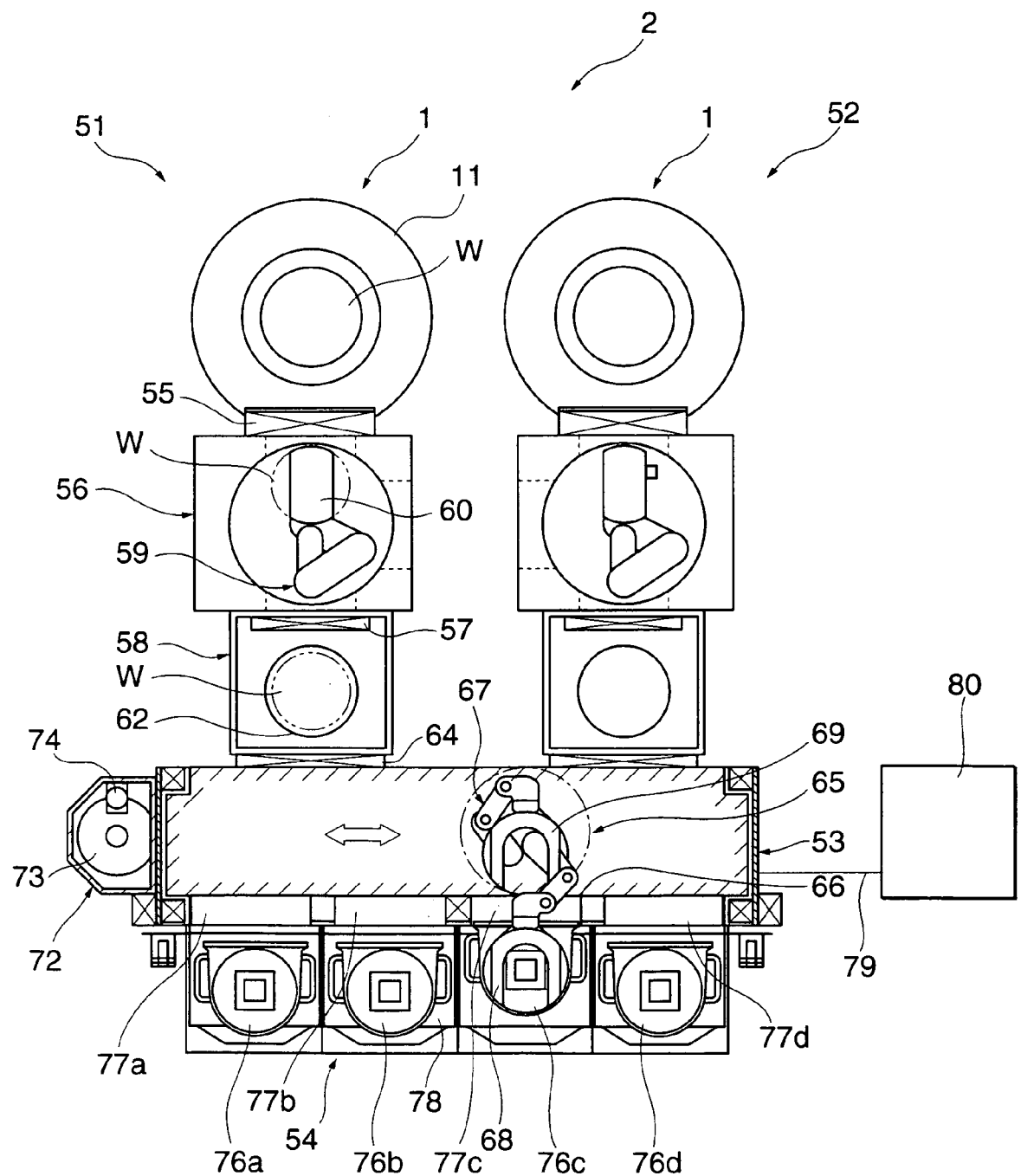
FIG. 1 is a plan view schematically showing the construction of a substrate processing apparatus according to an embodiment of the present invention.

FIG. 1 is a plan view schematically showing the construction of a substrate processing apparatus according to an embodiment of the present invention.

In FIG. 1, a plasma processing system 2, as the substrate processing apparatus according to the present embodiment, has a first processing unit 51 and a second processing unit 52 in which are carried out etching on semiconductor wafers W, a substrate transferring in/out stage 53, FOUP platforms 54 having FOUPs mounted thereon, and a control unit 80 that controls the operation of the plasma processing system 2.

The first processing unit 51 is comprised of a plasma processing apparatus 1 having a processing chamber 11 in which etching is carried out on the semiconductor wafers W, a transfer chamber 56 that is connected to the processing chamber 11 of the plasma processing apparatus 1 via a gate valve 55 that can be opened and closed so as to change a state of gas-tightness and is for transferring the semiconductor wafers W into and out of the processing chamber 11, and a load lock chamber 58 that is connected to the transfer-chamber 56 via a gate valve 57 that can be opened and closed so as to change a state of gas-tightness and is for temporarily holding a semiconductor wafer W. The second processing unit 52 has the same construction as the first processing unit 51, and hence description is omitted.

The transfer chamber 56 is constructed such as to be able to be purged of residual matter (particles) and be evacuated to a vacuum. Inside the transfer chamber 56 is provided, for example, a multi-jointed scalar type transfer arm 59 that is able to bend, elongate and turn and is for carrying out transfer of the semiconductor wafers W in and out between the processing chamber 11, the load lock chamber 58 and the transfer chamber 56. A mounting plate 60 on which a semiconductor wafer W can be mounted is provided at a tip of the transfer arm 59.

The load lock chamber 58 is also constructed such as to be able to be purged of residual matter and be evacuated to a vacuum, and has provided therein a handover platform 62 on which a semiconductor wafer W can be mounted. The handover platform 62 may as required have a cooling jacket provided therein so as to cool semiconductor wafers W that have been processed, or have a heating lamp provided thereon so as to preheat semiconductor wafers W before being processed. Moreover, the handover platform 62 may be made to have a multi-tiered structure so that a plurality of the semiconductor wafers W can be mounted thereon.

The substrate transferring in/out stage 53 has a substantially rectangular parallelepipedal box shape. The load lock chamber 58 of each of the first processing unit 51 and the second processing unit 52 is connected to a side of the substrate transferring in/out stage 53 via a gate valve 64 that can be opened and closed so as to change a state of gas-tightness. Moreover, an orienter (orienting chamber) 72 having therein a rotating mounting platform 73 and an optical sensor 74 that optically detects a peripheral edge portion of each semiconductor wafer W is provided at one end of the substrate transferring in/out stage 53. The orienter 72 detects whether each semiconductor wafer W is disposed horizontally (orientation flat), and whether there is a notch or the like in each semiconductor wafer W, using the optical sensor 74, and rotates the semiconductor wafer W using the rotating mounting platform 73, thus orienting the semiconductor wafer W.

Moreover, the substrate transferring in/out stage 53 has provided therein a transfer arm 65 constructed so as to be able to move along a guiding rail, not shown, disposed in a longitudinal direction of the substrate transferring in/out stage 53. The transfer arm 65 has, for example, individually driven multi-jointed forks 66 and 67 for wafer transfer. The multi-jointed forks 66 and 67 are each constructed so as to be able to bend, elongate and turn. Moreover, the transfer arm 65 has an arm 68 on a tip of the multi-jointed fork 66, and an arm 69 on a tip of the multi-jointed fork 67, each of the arms 68 and 69 being able to hold a semiconductor wafer W.

The transfer arm 65 can transfer semiconductor wafers W housed in FOUPs 76 mounted on the FOUP platforms 54, described below, onto the rotating mounting platform 73 in the orienter 72 and onto the handover platform 62 in each of the load lock chambers 58, and moreover can transfer semiconductor wafers W mounted on the handover platforms 62 onto the rotating mounting platform 73 or into the FOUPs 76. Each FOUP 76 has the same structure as the FOUP 500 described earlier, and has 25 slots therein, and hence can house 25 semiconductor wafers W.

Furthermore, the substrate transferring in/out stage 53 has formed in a side thereof opposite the side connected to the load lock chambers 58, four ports 77 (openings) that can be freely opened and closed, and has the FOUP platforms 54 projecting out from the side of the substrate transferring in/out stage 53 in positions corresponding to the positions of the ports 77. Each FOUP platform 54 has a mounting surface 78 on which a FOUP 76 is mounted, and has a FOUP opener (not shown) for opening and closing the lid of the FOUP 76 mounted on the mounting surface 78.

When an unprocessed semiconductor wafer W housed in one of the FOUPs 76 is to be processed, the lid of that FOUP 76 is opened by the FOUP opener, and moreover the port 77 corresponding to the FOUP platform 54 on which that FOUP 76 is mounted is opened, and the transfer arm 65 transfers the semiconductor wafer W housed in the FOUP 76 out. Next, the semiconductor wafer W that has been transferred out is transferred into the processing chamber 11 of the plasma processing apparatus 1 via the orienter 72, the load lock chamber 58 and the transfer chamber 56, and is subjected to etching in the processing chamber 11.

Moreover, the FOUPs 76 house not only semiconductor wafers W for products, but also dummy wafers, which are semiconductor wafers for inspection. A FOUP 76 housing such dummy wafers is mounted on one of the FOUP platforms 54. Here, the port 77 corresponding to the FOUP platform 54 on which is mounted the FOUP 76 housing the dummy wafers is referred to as the "special port" in particular. In FIG. 1, a port 77*d* corresponding to the FOUP platform 54 furthest from the orienter 72 in the longitudinal direction of the substrate transferring in/out stage 53 is such a special port.

Each dummy wafer is a non-product semiconductor wafer that is actually subjected to etching or transfer in the plasma processing system 2, to check on the state of the etching being carried out in the processing chamber 11 of the plasma processing apparatus 1, or the state of operation of the transfer arm 59 in the transfer chamber 56. Specifically, each dummy wafer may be, for example, any of the following: an etch rate dummy wafer that is actually subjected to the etching to check on the etching depth or the like in the etching in the processing chamber 11; a test dummy wafer that is actually transferred into and out of a predetermined transfer chamber to check on the state of operation of the transfer arm 59 or the like; a seasoning dummy wafer that is actually subjected to the etching to stabilize the atmosphere in the processing chamber 11 at an atmosphere fulfilling predetermined processing conditions for the etching after cleaning of the processing chamber 11 or replacement of a component part has been carried out; a particle monitor dummy wafer that is actually transferred into the processing chamber 11 or the transfer chamber 56 so that particles are attached thereto to measure the amount of particles in the processing chamber 11 or the transfer chamber 56. These dummy wafers differ in terms of form of surface finish or material depending on the contents of the inspection, and hence dummy wafers used in a certain type of inspection cannot be used in other types of inspection.

In general, the plasma processing system 2 has only one port that is a special port, and hence there is only one FOUP 76 in which such dummy wafers are housed, this FOUP 76 housing at least one of each of an etch rate dummy wafer, a test dummy wafer, a seasoning dummy wafer, and a particle monitor dummy wafer. A plurality of types of dummy wafer are thus present mixed together in the FOUP 76. A housing state relating to the arrangement of the plurality of types of dummy wafer in the FOUP 76 is continually stored in an HDD 82, described below, in the control unit 80 as dummy wafer setup information. Specifically, the housing state before and that after FOUP 76 removal/installation for dummy wafer replacement are stored in the HDD 82 as dummy wafer setup information as described below.

The control unit 80 is connected to the substrate transferring in/out stage 53 via a communication cable 79, and controls the overall operation of the plasma processing system 2 in accordance with a user's inputs or the like.

Figure 2:
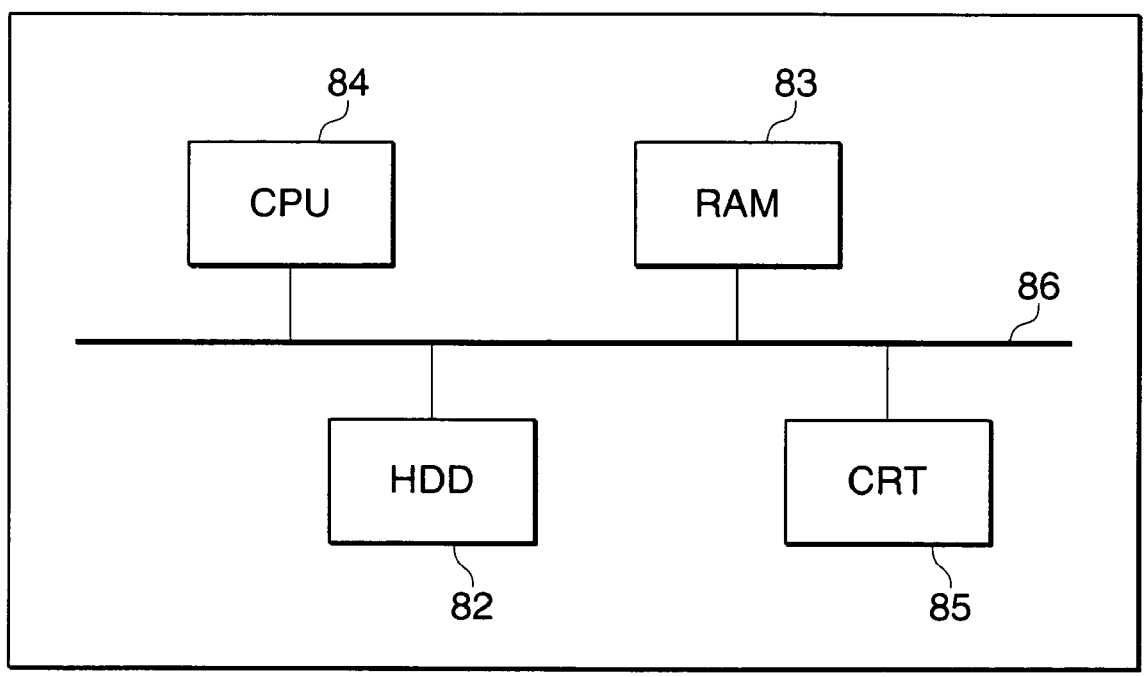
FIG. 2 is a view schematically showing the construction of a control unit appearing in FIG. 1.

FIG. 2 is a view schematically showing the construction of the control unit 80 shown in FIG. 1.

In FIG. 2, the control unit 80 is comprised of the HDD 82 (hard disk drive) which is a storage device storing sequence control programs (including a dummy wafer setup information editing process described later) for the plasma processing system 2, etching process recipes, and sets of dummy wafer setup information as described above, a RAM 83 which is a work area into which a sequence control program, a process recipe or the like from the HDD 82 is temporarily loaded, a CPU 84 (central processing unit) which implements a sequence control program or the like loaded in the RAM 83, or refers to a process recipe loaded in the RAM 83 during etching, a CRT 85 which is a display device that displays contents of dummy wafer setup information stored in the HDD 82, and a bus 86 that connects the HDD 82, the RAM 83, the CPU 84, and the CRT 85 to each other. The CPU 84 of the control unit 80 not only carries out etching on semiconductor wafers W while referring to a process recipe loaded in the RAM 83, but also, in each of periodic inspections during mass production of semiconductor wafers, selects a dummy wafer to be used in each inspection and transfers this dummy wafer out from the FOUP 76, referring at this time to dummy wafer setup information that is similarly loaded in the RAM 83.

Figure 3:
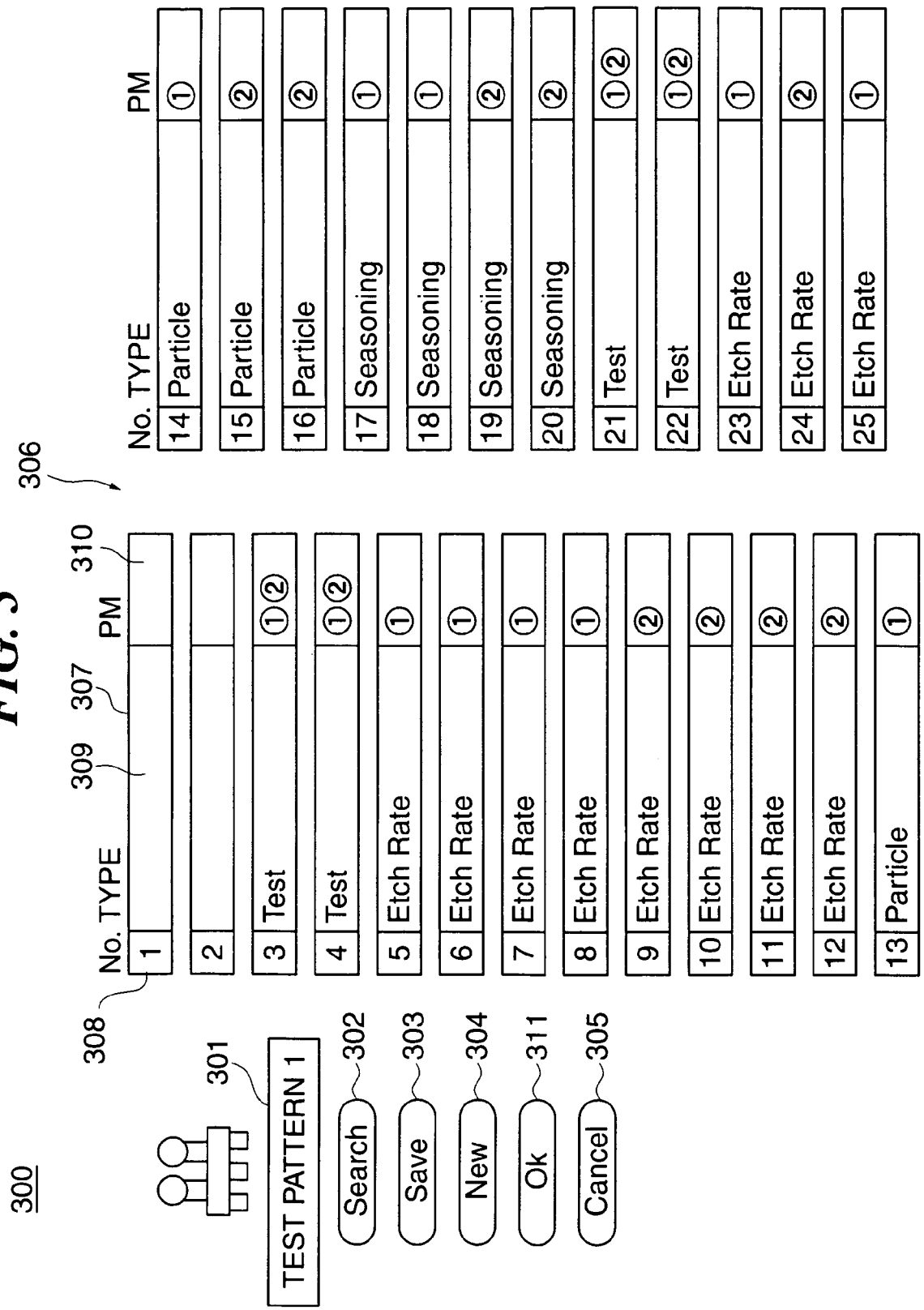
FIG. 3 is a view showing a dummy wafer setup information editing screen displayed on a CRT appearing in FIG. 2.

FIG. 3 is a view showing a dummy wafer setup information editing screen 300 that is displayed on the CRT 85 shown in FIG. 2 and shows contents of dummy wafer setup information.

In FIG. 3, the dummy wafer setup information editing screen 300 has thereon a dummy wafer setup information name display field 301 for displaying/inputting the name of dummy wafer setup information, a search button 302 for inputting a command to search for dummy wafer setup information corresponding to a name that has been inputted into the dummy wafer setup information name display field 301 by a user, a save button 303 for inputting a command to save dummy wafer setup information that has been edited in a dummy wafer setup information contents display section 306, described below, a new button 304 for inputting a command to update the dummy wafer setup information contents display section 306 so that new dummy wafer setup information can be set, an OK button 311 for inputting a command to set dummy wafer setup information that has been set in the dummy wafer setup information contents display section 306, a cancel button 305 for inputting a command to delete dummy wafer setup information that has been set, and the dummy wafer setup information contents display section 306 for editing dummy wafer setup information.

The dummy wafer setup information contents display section 306 is comprised of dummy wafer detailed information fields 307 corresponding one-to-one to the 25 slots possessed by the FOUP 76. Each dummy wafer detailed information field 307 is comprised of a slot number field 308 that displays a number assigned to the corresponding slot, a dummy wafer type field 309 that displays the type of the dummy wafer inserted into that slot, and a plasma processing apparatus number field 310 that displays number(s) assigned to plasma processing apparatus(es) for which that dummy wafer is used in inspection. Here, each dummy wafer type field 309 and plasma processing apparatus number field 310 can be selected by a user using a pointing device such as a mouse, whereby the contents thereof can be changed or inputted.

For the plasma processing system 2, in the case that one of the dummy wafers housed in the FOUP 76 has reached its lifetime, FOUP 76 removal/installation is carried out so that the dummy wafer can be replaced, and at this time a user inputs/sets dummy wafer setup information for the installed FOUP 76. Specifically, when FOUP 76 removal/installation is carried out for the port 77d, the CPU 84 of the control unit 80 displays a dialog or the like on the CRT 85 prompting the user to input/set dummy wafer setup information for the installed FOUP 76.

Upon noticing this dialog, the user inputs/sets dummy wafer setup information for the FOUP 76 using the dummy wafer setup information editing screen 300, and at this time can select either to use dummy wafer setup information stored in the HDD 82 as it is, or to edit dummy wafer setup information stored in the HDD 82, or to set new dummy wafer setup information from scratch.

Figure 4:
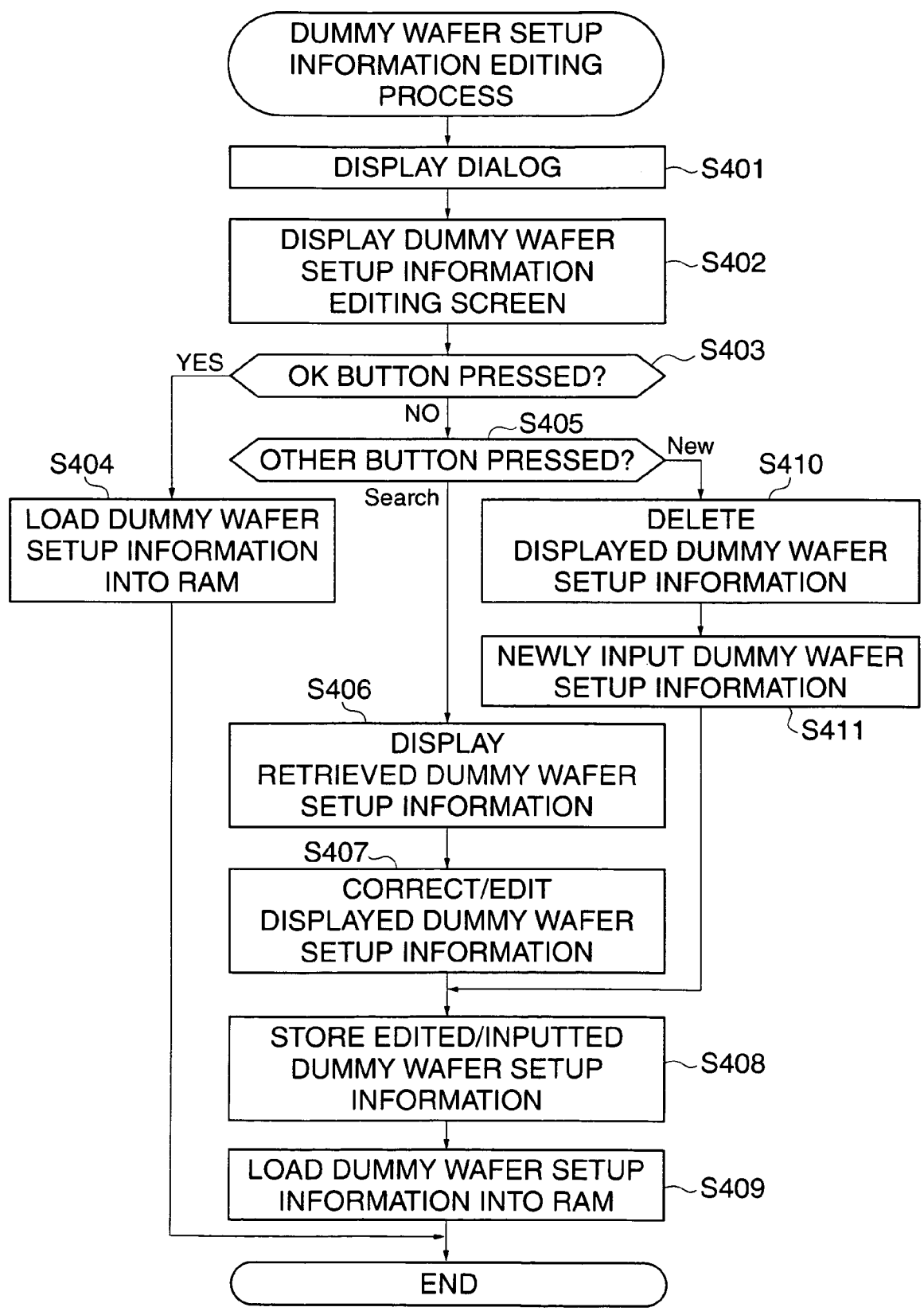
FIG. 4 is a flowchart showing a dummy wafer setup information editing process.

FIG. 4 is a flowchart showing a dummy wafer setup information editing process for editing dummy wafer setup information using the dummy wafer setup information editing screen 300. This process is executed by the CPU 84 of the control unit 80.

In FIG. 4, when removal/installation of FOUPs 76 housing dummy wafers is carried out, the CPU 84 displays on the CRT 85 a dialog or the like prompting inputting/setting of dummy wafer setup information (step S401).

Next, upon a user pressing a confirm button (not shown) in the dialog using a mouse or the like, the CPU 84 displays the dummy wafer setup information editing screen 300 on the CRT 85 (step S402). At this time, the dummy wafer setup information contents display section 306 has displayed therein the contents of the dummy wafer setup information that had been set immediately before the FOUP 76 removal/installation was carried out, and the CPU 84 determines whether or not the OK button 311 has been pressed (step S403).

If the result of the determination in the step S403 is that the user has pressed the OK button 311 ("YES" to the step S403), then the CPU 84 loads the displayed dummy wafer setup information as new dummy wafer setup information into the RAM 83 of the CPU 84 (step S404), and then the present process is terminated.

If the user has not pressed the OK button 311 ("NO" to the step S403), then the CPU 84 determines whether or not the user has pressed another button (step S405).

If the result of the determination in the step S405 is that the user has pressed the search button 302 ("SEARCH" to the step S405), then the CPU 84 searches for a set of dummy wafer setup information corresponding to a name entered in the dummy wafer setup information name display field 301 from out of a plurality of sets of dummy wafer setup information stored in the HDD 82, and displays the contents of the set of dummy wafer setup information thus retrieved in the dummy wafer setup information contents display section 306 (step S406). Next, the user edits the displayed contents of the dummy wafer type fields 309 and the plasma processing apparatus number fields 310, correcting only places where the displayed contents do not match the actual housing state of dummy wafers in the FOUP 76, so as to make the displayed contents match the actual housing state (step S407). Once the editing has been completed, the user inputs a new name into the dummy wafer setup information name display field 301, and presses the save button 303, thus inputting a command to save the edited dummy wafer setup information. Upon this save command being inputted, the CPU 84 stores the edited dummy wafer setup information in the HDD 82 linked to the name that has been inputted into the dummy wafer setup information name display field 301 (step S408). In this way, the edited dummy wafer set up information, i.e. the setup information after FOUP 76 removal/installation for dummy wafer replacement is stored in the HDD 82 together with the original dummy wafer setup information after the FOUP 76 removal/installation.

Next, the user presses the OK button 311, thus inputting a command to set the edited dummy wafer setup information. Upon this set command being inputted, the CPU 84 loads the edited dummy wafer setup information in the RAM 83 (step S409).

Moreover, if the user does not press the OK button 311 but rather presses the cancel button 305, then the CPU 84 loads in the RAM 83 not the edited dummy wafer setup information but rather, for example, the dummy wafer setup information that had been set immediately before the FOUP 76 removal/installation was carried out. After that, the CPU 84 terminates the present process.

If the result of the determination in the step S405 is that the user has pressed the new button 304 ("NEW" to the step S405), then the CPU 84 deletes the contents of the dummy wafer setup information displayed in the dummy wafer setup information contents display section 306 (step S410). The user then sets new dummy wafer setup information, by newly inputting from scratch such that the contents of the dummy wafer type field 309 and the plasma processing apparatus number field 310 of each of the dummy wafer detailed information fields 307, which have become blank upon the dummy wafer setup information being deleted, come to match the actual housing state for the FOUP 76 (step S411). Once the setting of the dummy wafer setup information has been completed, the user inputs a new name into the dummy wafer setup information name display field 301, and presses the save button 303 and the OK button 311, thus causing the CPU 84 to carry out the steps S408 and S409 described earlier. After that, the CPU 84 terminates the present process.

Moreover, according to the plasma processing system 2, by carrying out the processing of the steps S408 and S409 in the process of FIG. 4 a plurality of times, a plurality of sets of dummy wafer setup information can be stored in the HDD 82.

According to the plasma processing system 2 of the present embodiment, the housing state relating to the arrangement of the plurality of types of dummy wafer in the FOUP 76 before FOUP 76 removal/installation for dummy wafer replacement as well as that after the same are stored as dummy wafer setup information in the HDD 82 of the control unit 80. As a result, the necessity for a user to newly input/set dummy wafer setup information to the control unit 80 every time FOUP 76 removal/installation is carried out is eliminated, and moreover by using dummy wafer setup information stored in the HDD 82, mismatches between the inputted/set dummy wafer setup information and the actual housing state of dummy wafers in the FOUP 76 due to input mistakes by the user can be prevented. The reliability of inspection of the various devices in the plasma processing system 2 can thus be improved, while reducing the burden on the user.

Moreover, according to the plasma processing system 2 described above, the HDD 82 stores a plurality of sets of dummy wafer setup information, and when FOUP 76 removal/installation is carried out, the contents of a set of dummy wafer setup information corresponding to a name inputted by the user from out of the plurality of stored sets of dummy wafer setup information is displayed on the dummy wafer setting information contents display section 306. As a result, when carrying out dummy wafer replacement, a desired set of dummy wafer setup information can be selected from out of the plurality of stored sets of dummy wafer setup information and used, and hence the efficiency of inputting/setting of the dummy wafer setup information by the user can be improved.

Furthermore, according to the plasma processing system 2 described above, a new set of dummy wafer setup information obtained by carrying out editing using the selected desired set of dummy wafer setup information is stored, and hence the user can input/set a new set of dummy wafer setup information using the desired set of dummy wafer setup information selected by the user. As a result, the efficiency of inputting/setting of the dummy wafer setup information by the user can be further improved, and moreover input mistakes by the user can be reduced as much as possible, and hence the reliability of inspection of the various devices in the plasma processing system 2 can be further improved.

The plurality of sets of dummy wafer setup information stored in the HDD 82 may respectively correspond to different types of etching, whereby even if the type of etching carried out in the plasma processing system 2 is changed, through the user using a set of dummy wafer setup information stored in the HDD 82 corresponding to the etching after the change, the dummy wafer setup information can be inputted/set swiftly. As a result, again the efficiency of inputting/setting of the dummy wafer setup information by the user can be further improved, and moreover input mistakes by the user can be reduced as much as possible.

According to the plasma processing system 2 described above, the lifetime of a dummy wafer is judged from the number of times that that dummy wafer has been used in inspection or the time period for which that dummy wafer has been used in inspection, and regarding the dummy wafer lifetime, a default value is set for each type of dummy wafer and stored in the HDD 82 or the like. However, when, for example, the plasma processing apparatus 1 carries out special plasma processing, the default value for the lifetime may not be applicable as it is. In such as case, a lifetime different to the default value may be set individually for each dummy wafer in the dummy wafer detailed information field 307 on the dummy wafer setting information editing screen 300.

Moreover, in the plasma processing system 2 described above, there is only one special port, but depending on the system, a plurality of special ports may be set, the plasma processing system 2 accordingly having a plurality of FOUPs 76 housing dummy wafers. With such a plasma processing system, when carrying out a periodic inspection during mass production of semiconductor wafers, the CPU 84 selects the FOUP 76 housing the dummy wafer having the shortest lifetime out of the plurality of FOUPs 76, and selects the dummy wafer having the longest lifetime out of the plurality of dummy wafers in the selected FOUP 76. As a result, a situation in which, during periodic inspections, dummy wafers housed in a plurality of FOUPs 76 each reach their lifetime at the same time and hence a plurality of FOUPs 76 have to be removed from the ports 77 simultaneously can be prevented, and hence the efficiency of the inspection of the plasma processing apparatuses 1, the transfer chambers 56 and so on can be improved.

Moreover, a storage that is a device for housing a plurality of dummy wafers is known. The storage has a opening and a lid enabling the opening to be opened and closed freely, whereby each of housed dummy wafers can be replaced through the opening. During the replacement of the dummy wafers housed in the storage, problems similar to the problems described earlier can be raised. However, according to the plasma processing system 2 described above, in the case that the substrate transferring in/out stage 53 has a storage housing a plurality of dummy wafers at the opposite end of the substrate transferring in/out stage 53 to the end at which the orienter 72 is disposed, the CPU 84 stores the housing state relating to the arrangement of the plurality of types of dummy wafer in the storage as dummy wafer setup information in the HDD 82, and the user uses the dummy wafer setup information for the storage stored in the HDD 82 through the dummy wafer setting information editing screen 300. As a result, again the reliability of inspection of the various devices in the plasma processing system 2 can be improved, while reducing the burden on the user.

Moreover, it has been assumed that the processing carried out by the plasma processing system 2 described above is etching, but the processing carried out by the substrate processing apparatus according to the present invention is not limited to being etching. For example, any of sputtering, CVD, ion implantation, ashing, diffusion, annealing, or the like may be carried out, in which case dummy wafer setup information corresponding to this processing is stored in the HDD 82. Moreover, the substrates subjected to the processing are not limited to being semiconductor wafers, but rather may be flat panel display glass substrates or the like instead.

In the embodiment described above, a FOUP is used as the container housing the dummy wafers, but the container housing the dummy wafers is not limited to this. For example, a pod housing 200 mm-diameter semiconductor wafers may be used.

Figure 5:
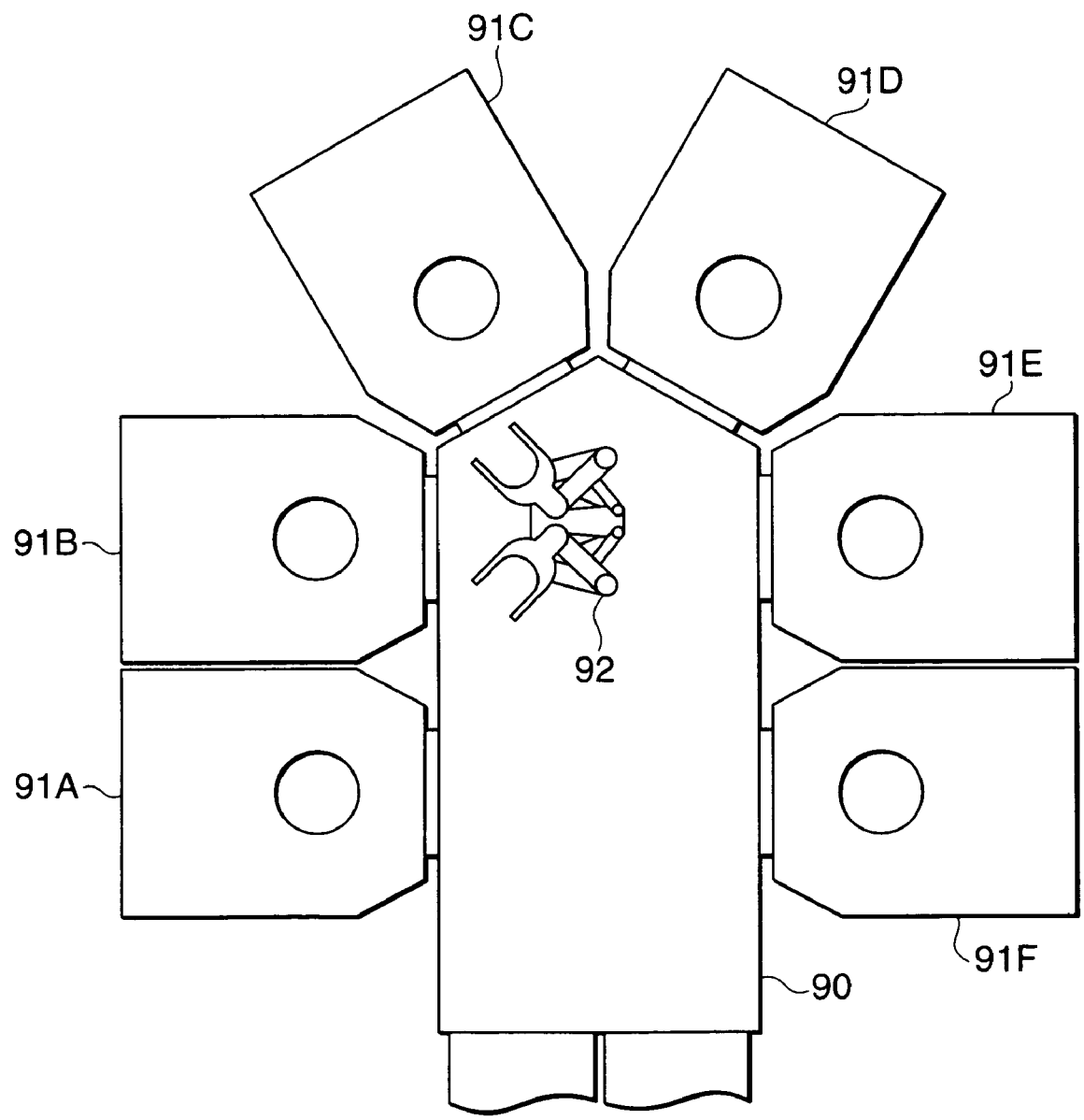
FIG. 5 is a plan view schematically showing the construction of a substrate processing apparatus according to another embodiment of the present invention.
Figure 6:
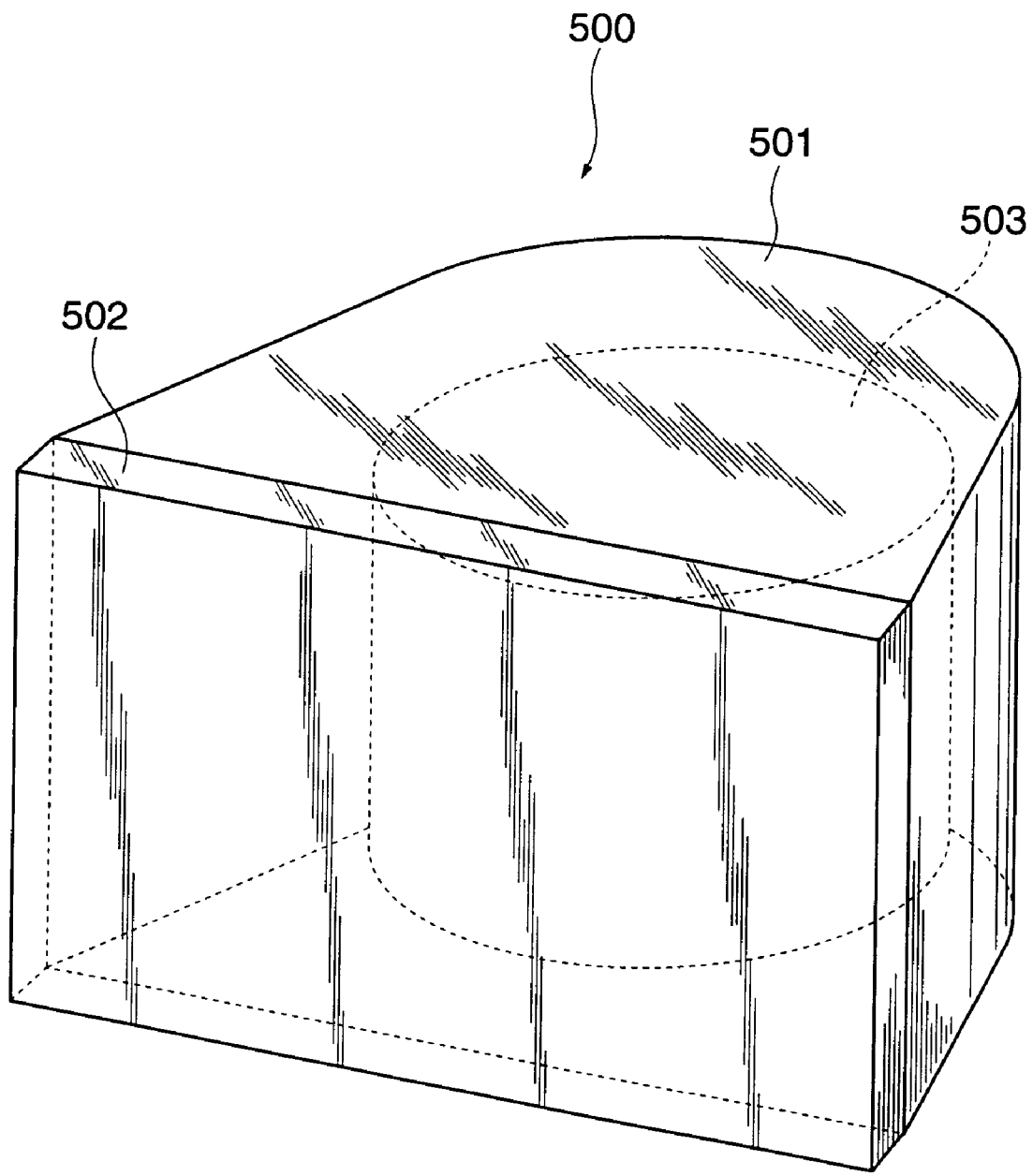
FIG. 6 is a view schematically showing the construction of a FOUP housing semiconductor wafers or dummy wafers.

Moreover, according to the plasma processing system 2 of the embodiment described above, a first processing unit 51 and a second processing unit 52 are connected to the substrate transferring in/out stage 53. However, as shown in FIG. 5, a transfer module 90 may be connected as a transfer chamber to the substrate transferring in/out stage 53 via two load lock chambers, and six processing chambers 91A to 91F may be disposed as plasma processing apparatuses in radial fashion around the transfer module 90. Moreover, in this case, a double arm type transfer mechanism 92 comprised of two scalar type transfer arms may be disposed in the transfer module 90.

Moreover, it is to be understood that that the object of the present invention can also be attained by supplying to the control unit 80 a storage medium (or recording medium) having stored thereon program code of software that realizes the functions of either of the embodiments described above, and then causing the CPU 84 of the control unit 80 to read out and execute the program code stored on the storage medium.

Moreover, it is to be understood that the functions of the embodiment described above can be realized not only through the CPU 84 reading out and executing the program code, but also by causing an operating system (OS) or the like run by the control unit 80 to perform part or all of the actual processing based on instructions in the program code.

Furthermore, it is to be understood that the functions of either of the embodiments described above can also be realized by writing the program code read out from the storage medium into a memory provided on a function expansion card inserted into the control unit 80 or in a function expansion unit connected to the control unit 80, and then causing a CPU or the like provided on the function expansion card or in the function expansion unit to perform part or all of the actual processing based on instructions in the program code.

Moreover, so long as the functions of either of the embodiments described above can be realized by the control unit 80, there are no particular limitations on the form of the program code, which may be any of object code, program code executed by an interpreter, script data supplied to an OS, and so on.

The storage medium for supplying the program code may be any storage medium capable of storing the program code, for example a RAM, an NV-RAM, a floppy (registered trademark) disk, a hard disk, an optical disk, a magnetic-optical disk, a CD-ROM, an MO, a CD-R, a CD-RW, a DVD (a DVD-ROM, a DVD-RAM, a DVD-RW, or a DVD+RW), a magnetic tape, a nonvolatile memory card, or another ROM. Alternatively, the program code may be supplied by being downloaded from another computer, database or the like, not shown, connected to an internet, a commercial network, a local area network or the like.

What is claimed is:

1. A substrate processing apparatus comprising:
   at least one vacuum processing chamber in which substrates are processed;
   at least one transfer chamber for transferring the substrates;
   a plurality of containers, each housing a plurality of inspection substrates for inspection of said vacuum processing chamber or said transfer chamber;
   a storage device; and
   a controller that causes said storage device to continue to store a housing state relating to an arrangement of the inspection substrates in said container as setup information at least during replacement period of the inspection substrates in said container, wherein
   said controller selects, as an inspection substrate to be used in inspection of said vacuum processing chamber or said transfer chamber, a container housing an inspection substrate having a shortest lifetime out of said containers, and selects an inspection substrate having a longest lifetime out of the inspection substrates in the selected container.

2. A substrate processing apparatus as claimed in claim 1, comprising a display device on which is displayed contents of the setup information, and wherein said controller causes said storage device to store a plurality of sets of setup information, and is responsive to installation of said container, for causing said display device to display contents of a desired set of setup information selected from the plurality of sets of setup information.

3. A substrate processing apparatus as claimed in claim 2, wherein said controller causes said storage device to store another set of setup information obtained by carrying out editing based on the selected desired set of setup information.

* * * * *